United States Patent
Ito

(10) Patent No.: US 7,757,192 B2
(45) Date of Patent: Jul. 13, 2010

(54) INTEGRATED CIRCUIT DESIGNING DEVICE, INTEGRATED CIRCUIT DESIGNING METHOD, AND INTEGRATED CIRCUIT DESIGNING PROGRAM

(75) Inventor: Noriyuki Ito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 394 days.

(21) Appl. No.: 12/019,208

(22) Filed: Jan. 24, 2008

(65) Prior Publication Data

US 2008/0184179 A1 Jul. 31, 2008

(30) Foreign Application Priority Data

Jan. 30, 2007 (JP) ............... 2007-018948

(51) Int. Cl.
G06F 17/50 (2006.01)
(52) U.S. Cl. ............... 716/5; 716/12; 716/13; 716/14
(58) Field of Classification Search ............ 716/5, 716/12–14
See application file for complete search history.

(56) References Cited

U.S. PATENT DOCUMENTS

| | | | | |
|---|---|---|---|---|
| 5,309,015 | A * | 5/1994 | Kuwata et al. ............... | 257/659 |
| 6,237,127 | B1 * | 5/2001 | Craven et al. ............... | 716/6 |
| 6,415,419 | B1 * | 7/2002 | Konno ............... | 716/4 |
| 6,708,314 | B2 * | 3/2004 | Trivedi et al. ............... | 716/2 |
| 7,237,217 | B2 * | 6/2007 | Restle ............... | 716/13 |
| 2004/0243956 | A1 * | 12/2004 | Tetelbaum et al. ............... | 716/6 |
| 2005/0050497 | A1 * | 3/2005 | Tetelbaum ............... | 716/6 |
| 2005/0283744 | A1 * | 12/2005 | Mochizuki ............... | 716/3 |
| 2006/0066342 | A1 * | 3/2006 | Cohn et al. ............... | 324/765 |
| 2007/0124714 | A1 * | 5/2007 | Ono et al. ............... | 716/10 |
| 2007/0157144 | A1 * | 7/2007 | Mai et al. ............... | 716/10 |

FOREIGN PATENT DOCUMENTS

| | | |
|---|---|---|
| JP | 06-342546 | 12/1994 |
| JP | 08-129576 | 5/1996 |
| JP | 2001-142915 | 5/2001 |
| JP | 2003-316843 | 11/2003 |

* cited by examiner

*Primary Examiner*—Jack Chiang
*Assistant Examiner*—Magid Y Dimyan
(74) *Attorney, Agent, or Firm*—Staas & Halsey

(57) ABSTRACT

Shielded clock wiring used in an integrated circuit is designed by storing a table of identifiers of shielded clock wiring usable in the integrated circuit, storing dividing rule information in correspondence with each identifier, describing a way of dividing the shielded clock wiring indicated by the each identifier; inputting a wiring layer of a shielded clock wiring of a wiring request, inputting an identifier of the shielded clock wiring of the wiring request and inputting a starting point and an end point of the shielded clock wiring of the wiring request; specifying a dividing rule of the shielded clock wiring indicated by the identifier; and judging whether to permit the shielded clock wiring of the wiring request, by judging whether shielded clock wiring resulting from division based on the dividing rule is spatially permissible.

11 Claims, 15 Drawing Sheets

FIG. 2
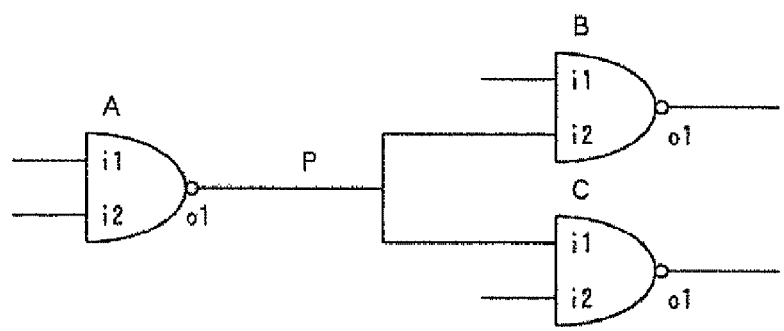
(a)
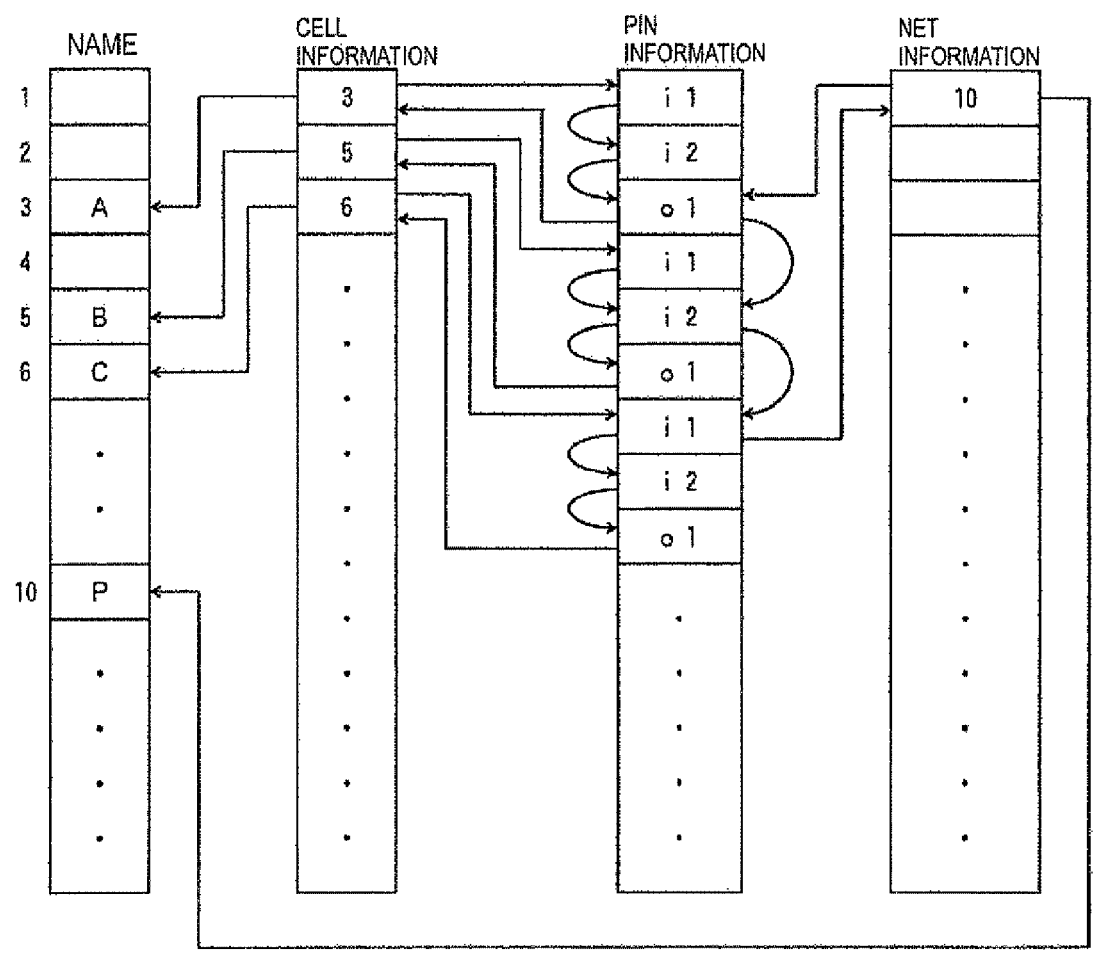
(b)

FIG.3

| WIRING LAYER | CLOCK WIRING NAME | SHIELDED CLOCK WIRING DIVIDING RULE |
|---|---|---|
| . | . | . |
| . | . | . |
| . | . | . |
| 8 | 8 – 1 | WIRING LAYER 8: WIDTH aa $\mu$ ; GND: -bb $\mu$  WIRING LAYER 8: WIDTH aa $\mu$ : CLK:0 $\mu$  WIRING LAYER 8: WIDTH aa $\mu$ : GND: +bb $\mu$<br>WIRING LAYER 6: WIDTH aa $\mu$ ; GND: -cc $\mu$  WIRING LAYER 6: WIDTH aa $\mu$ : GND: +cc $\mu$ |
|  | 8 – 2 | WIRING LAYER 8: WIDTH aa $\mu$ ; GND: -bb $\mu$  WIRING LAYER 8: WIDTH aa $\mu$ : CLK:0 $\mu$  WIRING LAYER 8: WIDTH aa $\mu$ : GND: +bb $\mu$ |
|  | . | . |
|  | . | . |
|  | . | . |
| . | . | . |
| . | . | . |
| . | . | . |
| . | . | . |

FIG.5

| NORMAL WIRING | WIRING THICKNESS = $\alpha\,\mu$ | | |
|---|---|---|---|
| CLOCK WIRING WITHOUT SHIELD | WIRING THICKNESS = $\beta\,\mu$ | | |
| SHEILDED CLOCK WIRING | WIRING LAYER | CLOCK WIRING NAME | WIRING THICKNESS |
| | ⋮ | ⋮ | ⋮ |
| | 8 | 8 − 1 | $p\,\mu$ |
| | | 8 − 2 | $q\,\mu$ |
| | | ⋮ | ⋮ |
| | ⋮ | ⋮ | ⋮ |

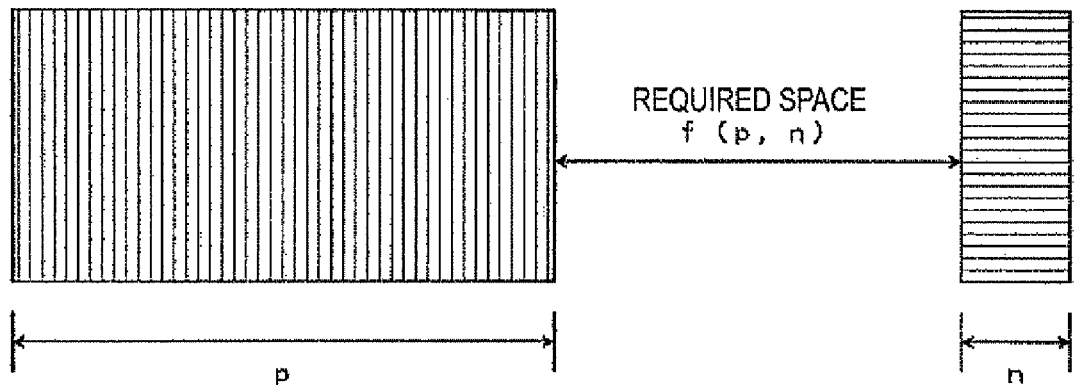
(a)
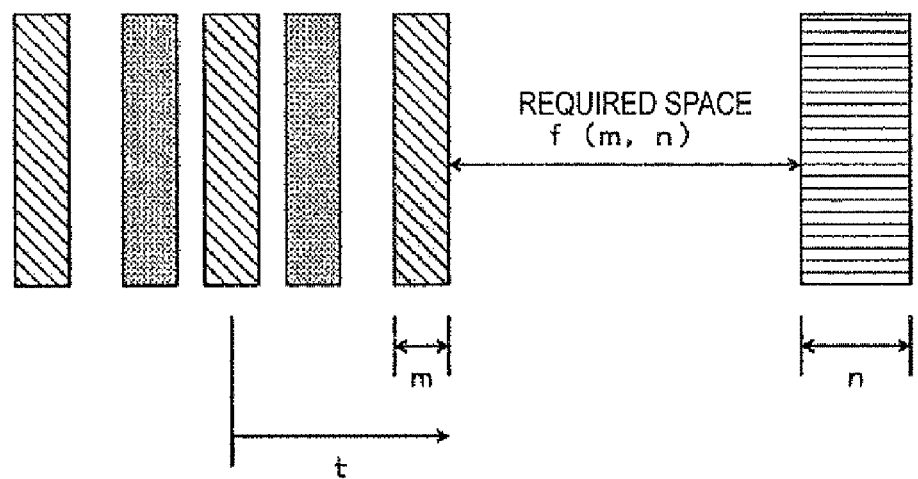
(b)
FIG. 6

INTEGRATED CIRCUIT DESIGNING DEVICE, INTEGRATED CIRCUIT DESIGNING METHOD, AND INTEGRATED CIRCUIT DESIGNING PROGRAM

BACKGROUND

The present disclosure relates to an integrated circuit designing device for designing integrated circuits, an integrated circuit designing method, and a recording medium having an integrated circuit designing program recorded thereon. In particular, the present disclosure relates to an integrated circuit designing device capable of efficiently executing a wiring design for shielded clock wiring used in an integrated circuit, an integrated circuit designing method, and a recording medium having an integrated circuit designing program recorded thereon.

Clock wiring used in integrated circuits must transmit a clock signal to an entire integrated circuit, and is therefore thicker than the wiring used to connect circuit cells. However, the clock wiring carries a high frequency clock signal.

As a result of these factors, the clock wiring is a source of noise which adversely affects neighboring wiring.

In view of the adverse effects of the generated noise, when integrated circuits are designed, shield wiring is provided on both sides of the clock wiring to prevent adverse effects on the neighboring wiring.

It is well known (see Japanese Unexamined Patent Application Publication No. H10-313056, for instance) that providing shield wiring in this way allows a reduction in the radiated noise from the integrated circuit.

One way to reduce the effects of the noise from the clock wiring on neighboring wiring is to narrow the thickness of the clock wiring. This is because reducing the thickness of the clock wiring reduces the range of the noise effects.

Thus, the effects can be reduced by constructing the clock wiring from a plurality of narrow wires rather than a single thick wire.

In Japanese Unexamined Patent Application Publication No. 2001-142915, the inventor discloses an invention for integrated circuit design using a layer-type layout method. The invention takes into account constraints on metal density due to characteristics of the semi-conductor, and, when single-wire wiring is specified and a thickness of the single-wire wiring is greater than or equal to a prescribed value, divides the single-wire wiring into a plurality of wires.

Japanese Unexamined Patent Application Publication No. H6-342456 discloses another invention for integrated circuit design. To ensure that wiring can be provided automatically without problems such as shorting caused by divergence of parallel wiring, wires that are to be bunched together are combined to form wide single-wire bunch-state wiring. After the remaining wiring has been drawn, the wide bunch-state wiring is divided.

When designing integrated circuits, providing shield wiring on both sides of the clock wiring is an extremely effective method of preventing adverse effects on the neighboring wiring.

However, the wiring pattern for this type of shielded clock wiring is complex, and so substantial work is required when it becomes necessary to revise the layout of a wired circuit.

There is, however, no technology in the related art for realizing the wiring for shielded clock wiring in an efficient manner.

To reduce the effects of the noise from the clock wiring on neighboring wiring, it is preferable that the thickness of the clock wiring is reduced.

However, for every reduction in the thickness of the clock wiring, the number of clock wires has to increase, and this change requires a substantial amount of work.

One way of addressing this problem is a method by which single-wire shielded clock wiring is provided and subsequently divided.

However, when designing an integrated circuit, providing and subsequently dividing single-wire shielded clock wiring can not be realized by simply dividing wiring.

In other words, not just the clock wiring, but all the wiring used in integrated circuits is subject to spatial constraints. New wiring cannot be provided in areas where wiring already exists. Moreover, even if an area in which the new wiring is to be provided is free, if the required gap between the new wiring and neighboring wiring cannot be secured, the new wiring cannot be provided in the area.

Therefore, even when single-wire shielded clock wiring has been successfully wired within the space constraints, wiring of the shielded clock wiring after division is not always possible.

Also, in the case of clock wiring, even if wiring is achieved in the available space, it is sometimes necessary to supply a synchronous clock to a plurality of different circuit cells, and so delay times must be considered when determining the final clock wiring layout.

Thus, even if the single-wiring shielded clock wiring can be wired so that the clock is synchronously supplied to the circuit cells which require a synchronous clock, it is sometimes the case that the clock cannot be supplied to the circuit cells synchronously once the single shielded clock wiring has been divided.

Therefore, when designing integrated circuits, providing and subsequently dividing single-wire shielded clock wiring can not be realized by simply dividing wiring.

Moreover, conventional technology for dividing single-wire wiring does not provide a technique for restoring the divided wiring to an original single-wire form.

When a layout including divided wiring is to be revised, it is sometimes the case that restoring the divided wiring to the original single-wire allows revision in a single operation and thereby simplifies the revision. However, conventional technology does not provide this capability.

The present disclosure was conceived upon consideration of these problems with the object of providing a new integrated circuit design technology capable of efficiently executing designs for shielded clock wiring during integrated circuit design.

SUMMARY

Various embodiments of the present invention provide an integrated circuit designing device for performing wiring design of shielded clock wiring used in an integrated circuit having a storage unit configured to store a table of identifiers of shielded clock wiring usable in the integrated circuit and dividing rule information in correspondence with each identifier, describing a way of dividing the shielded clock wiring indicated by the each identifier; an input unit configured to input a wiring layer of a shielded clock wiring of a wiring request, an identifier of the shielded clock wiring of the wiring request, and a starting point and an end point of the shielded clock wiring of the wiring request, and thereby input the wiring request for the shielded clock wiring; a specifying unit configured to refer to the storage unit to specify a dividing rule of the shielded clock wiring indicated by the identifier inputted by the input unit; and a judging unit configured to judge whether to permit the shielded clock wiring of the wiring request, by judging whether shielded clock wiring resulting from division based on the dividing rule specified by the specifying unit is spatially permissible.

Various embodiments of the present invention provide an integrated circuit designing method executed by an integrated circuit designing device for performing wiring design of shielded clock wiring used in integrated circuits by inputting a wiring layer of shielded clock wiring of a wiring request, an identifier of the shielded clock wiring of the wiring request, and a starting point and an end point of the shielded clock wiring of the wiring request, and thereby inputting the wiring request for the shielded clock wiring; specifying a dividing rule of shielded clock wiring indicated by the inputted identifier, by referring to a storage unit configured to store a table of identifiers of shielded clock wiring usable in the integrated circuit and, in correspondence with each identifier, dividing rule information describing a way of dividing the shielded clock wiring indicated by the each identifier; and judging whether to permit the shielded clock wiring of the wiring request, by judging whether shielded clock wiring resulting from division based on the specified dividing rule is spatially permissible.

Various embodiments of the present invention provide a recording medium having stored thereon an integrated circuit designing program used to realize an integrated circuit designing device for performing wiring design of shielded clock wiring used in integrated circuits, the integrated circuit designing program causing a computer to function as an input unit configured to input a wiring layer of a shielded clock wiring of a wiring request, an identifier of the shielded clock wiring of the wiring request, and a starting point and an end point of the shielded clock wiring of the wiring request, thereby inputting the wiring request for the shielded clock wiring; a specifying unit configured to specify a dividing rule of shielded clock wiring indicated by the inputted identifier, by referring to a storage unit configured to store a table of identifiers of shielded clock wiring usable in the integrated circuit and, in correspondence with each identifier, dividing rule information describing a way of dividing the shielded clock wiring indicated by the each identifier; and a judging unit configured to judge whether to permit the shielded clock wiring of the wiring request, by judging whether shielded clock wiring resulting from division based on the dividing rule specified by the specifying unit is spatially permissible.

Various embodiments of the present invention provide an integrated circuit designing device for designing specified wiring to be used in an integrated circuit having a storing unit configured to store an identifier for specified wiring usable in an integrated circuit in correspondence with dividing rule information describing a way of dividing the specified wiring indicated by the identifier; an input unit configured to receive input for a wiring request of the specified wiring by receiving input of a wiring layer for the specified wiring, the identifier for the specified wiring, and a starting point and an end point for the specified wiring; a specifying unit configured to specify a dividing rule of the specified wiring indicated by the identifier inputted from the input unit, by referring to the storage unit using the identifier of the specified wiring; and a judging unit configured to judge whether to permit the specified wiring of the wiring request by judging whether placement of specified wiring resulting from division based on the dividing rule specified by the specifying unit is spatially permissible.

The above-described embodiments of the present invention are intended as examples, and all embodiments of the present invention are not limited to including the features described above.

BRIEF DESCRIPTION OF THE DRAWINGS

FIG. 2 is an illustrative example of a data structure, according to various embodiments of the present invention.

FIG. 3 is an illustrative example of defining information stored by a dividing rule defining unit, according to various embodiments of the present invention;

FIG. 5 is an illustrative example of defining information stored by a wiring defining unit, according to various embodiments of the present invention;

FIG. 6 is an illustrative example of processing for calculating required space, according to various embodiments of the present invention;

DETAILED DESCRIPTION OF THE PREFERRED EMBODIMENTS

Figure 1:
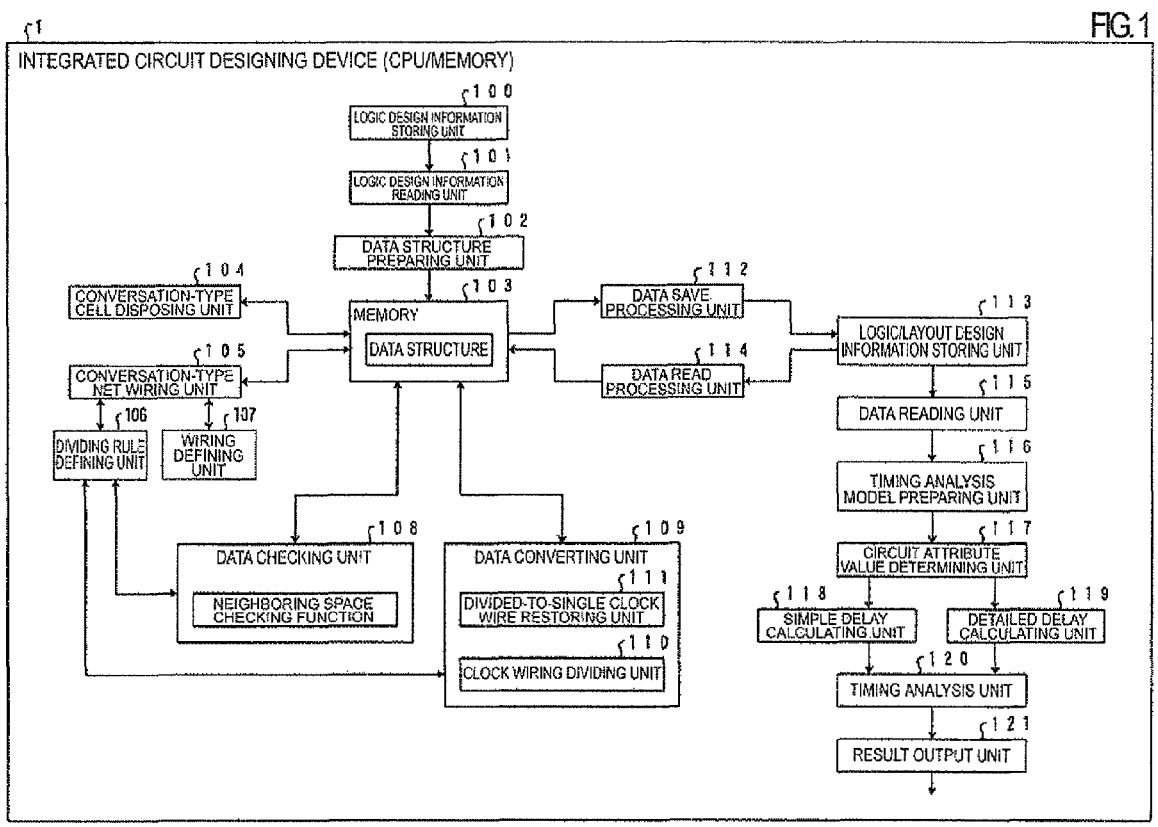
FIG. 1 is an illustrative example of an integrated circuit designing device, according to various embodiments of the present invention.

The following is a detailed description of an embodiment of an integrated circuit design device.

Reference may now be made in detail to embodiments of an integrated circuit, examples of which are illustrated in the accompanying drawings, wherein like reference numerals refer to like elements throughout.

FIG. 1 shows a first embodiment of an integrated circuit designing device 1.

A logic design information storing unit 100 provided in the integrated circuit designing device 1 of the present embodiment has integrated circuit logic design information stored as text data therein. A logic design information reading unit 101 reads the logic design information stored in the logic design information storing unit 100.

A data structure preparing unit 102 converts the logic design information read by the logic design information reading unit 101 to a data structure capable of being processed by a computer, and transfers the data structure to a memory 103. For instance, logic design information of the type shown in FIG. 2A is converted to a data structure of the type shown in FIG. 2B.

A communication-type cell disposing unit 104 determines cell placement in accordance with communication processing on the data structure held in the memory 103. A communication-type net wiring unit 105 determines wiring between cells in accordance with communication processing on the data structure held in the memory 103.

A dividing rule defining unit 106 stores dividing rule information for shielded clock wiring wired by the communication-type net wiring unit 105.

As shown in FIG. 3, for each wiring layer, the dividing rule defining unit 106 stores an identifier (which identifies a wiring type) for each shielded clock wiring usable in the wiring layer. The dividing rule defining unit 106 also stores dividing rule information describing the manner which the shielded clock wiring associated with each identifier is to be divided in correspondence with the identifiers.

Figure 4:
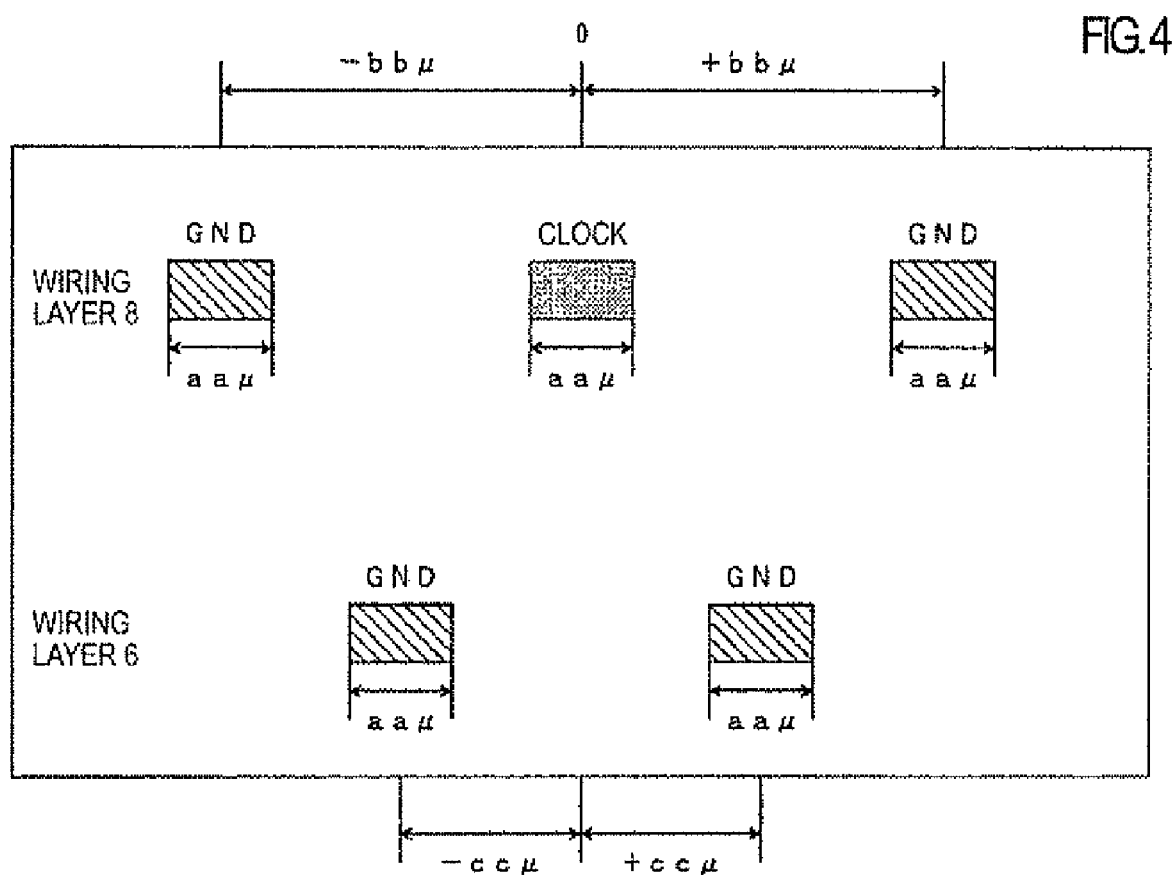
FIG. 4 is an illustrative example of an example of dividing a shielded clock wire, according to various embodiments of the present invention.

For instance, the shielded clock wiring identifier "8-1" shown in FIG. 3 indicates division in accordance with a dividing rule that provides shielded clock wiring in wiring layer 8 and a ground layer in wiring layer 6, as shown in FIG. 4.

A wiring defining unit 107 stores thickness information for regular wiring and clock wiring that is to be wired by the communication-type net wiring unit 105.

The wiring defining unit 107 stores information indicating that the thickness of regular wiring is $\alpha\mu$ and the thickness of the clock wiring without shielding is $\beta\mu$, as shown in FIG. 5, For each wiring layer, the wiring defining unit 107 also stores identifiers (which identify wiring type) in a table for each shielded clock wiring usable in the wiring layer. The wiring defining unit 107 also stores thickness information for the shielded clock wiring associated with each identifier in correspondence with the identifiers.

Here, the thickness used for the shielded clock wiring takes into account calculation processing that is to be executed after the division to calculate a required space between the divided shielded clock wiring and the neighboring wiring.

Thus, as shown in FIG. 6A, when the required space before division between a wire of thickness p and a wire of thickness n calculated using a function f (which may be prepared as a conversion table) such that required space=$f(p,n)$ where p is the thickness of wiring before division and n is the thickness of neighboring wiring, the required space after division between a wire of thickness m and the wire of thickness n is found using required space=$f(m,n)$ where m is the thickness of the outermost wiring.

Here, a thickness p that satisfies the equation $t+f(m,n)=p/2+f(p,n)$ where t is a distance to a central portion of the divided wiring which is used as the shielded clock wiring thickness before division.

Thus, the thickness of the shielded clock wiring is set so that the required space, between the shielded clock wiring and the neighboring wiring, calculated before division based on a function f(x,y) satisfies the conditions on the required space, between the divided shielded clock wiring and the neighboring wiring, calculated after division based on the function f(x,y). As a result, it is generally possible to judge, from a required space judgment performed before division of the clock wiring, about a required space that is calculated after the division.

A data checking unit 108 judges whether wiring wired by the communication-type net wiring unit 105 is spatially permissible, and transmits a judgment result to the communication-type net wiring unit 105. The data checking unit 108 also includes an neighboring space checking function to calculate a required space between the wiring wired by the communication-type net wiring unit 105 and the neighboring wiring using the above-described function f, and judge whether an actual space between the wiring wired by the communication-type net wiring unit 105 and the neighboring wiring is greater than the required space. The data checking unit 108 then judges whether conditions for the required space are satisfied, and transmits the judgment result to the communication-type net wiring unit 105.

A data converting unit 109 includes a clock wiring dividing unit 110 configured to divide shielded clock wiring in accordance to the dividing rules stored in the dividing rule defining unit 106. The data converting unit 109 further includes a divided-to-single clock wire restoring unit 111 for restoring the shielded clock wiring divided by the clock wiring dividing unit 110 to the pre-division single-wire state. The data converting unit 109 executes processing to divide the single-wire shielded clock wiring described in the data structure held in the memory 103, and to restore the divided shielded clock wiring described in the data structure held in the memory 103 to the single-wire state.

A data save processing unit 112 saves the data structure, in which cell positions and the wiring between cells is determined, from the memory 103 to a logic/layout design information storing unit 113. A data read processing unit 114 reads the data structure stored in the logic/layout design information storing unit 113, and transfers the read data structure to the memory 103.

A data reading unit 115 reads the data structure stored in the logic/layout design information storing unit 113. A timing analysis model preparing unit 116 prepares a timing analysis model for a designed integrated circuit, based on the data structure read by the data reading unit 115.

A circuit attribute value determining unit 117 determines circuit attribute values necessary for delay calculations to be performed using the timing analysis model prepared by the timing analysis model preparing unit 116.

At this point, the circuit attribute determining unit 117 calculates values which enable prescribed circuit attribute values to be realized for the divided shielded clock wiring, as the circuit attribute values of the pre-division shielded clock wiring. In other words, the circuit attribute values of the pre-division shielded clock wiring are determined so that input/output characteristics that are substantially the same as the input/output characteristics of the divided shielded clock wiring are realized.

Figure 7:
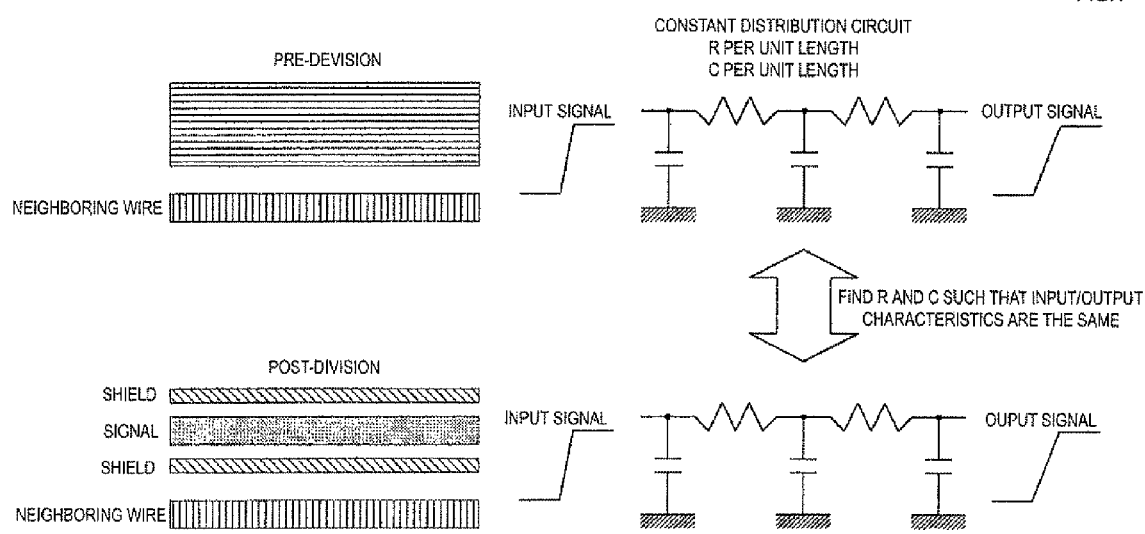
FIG. 7 is an illustrative example of a procedure for determining circuit attribute values required for delay calculation, according to various embodiments of the present invention.

For instance, when the shielded clock wiring is modeled as a constant distribution circuit with constant distribution parameters resistance and capacitance (R, C) for the pre-division shielded clock wiring, values are calculated as shown in FIG. 7 so that constant distribution circuit parameters (R, C) are realized for the divided shielded clock wiring. The calculated values are then selected as the circuit attribute values of the pre-division shielded clock wiring.

Thus, values which enable the prescribed circuit attribute values to be realized for the divided shielded clock are calculated as the circuit attribute values for delay calculations in the pre-division shielded clock wiring, and the calculated values are selected as the circuit attribute values of the pre-division shielded clock wiring. As a result, it is generally possible to realize the delay calculations that are to be performed after division using the delay calculations performed before the division.

A simple delay calculating unit 118 performs delay calculations using the circuit attribute values of the pre-division shielded clock wiring. A detailed delay calculating unit 119 performs delay calculations using the circuit attribute values of the divided shielded clock wiring.

Here, the delay calculations performed by the simple delay calculating unit 118 are based on the circuit attribute values of the pre-division shielded clock wiring. However, since these are circuit attribute values determined to enable the prescribed circuit attribute values to be realized for the divided shielded clock wiring, it is possible to perform delay calculations which substantially resemble the delay calculations necessary after the division.

A timing analysis unit 120 performs analysis of timing in the designed integrated circuit based on the delay calculations performed by the simple delay calculating unit 118, and performs analysis of timing in the designed integrated circuit based on the delay calculations performed by the detailed delay calculating unit 119. A result outputting unit 121 outputs results of the analysis by the timing analysis unit 120.

Figure 8:
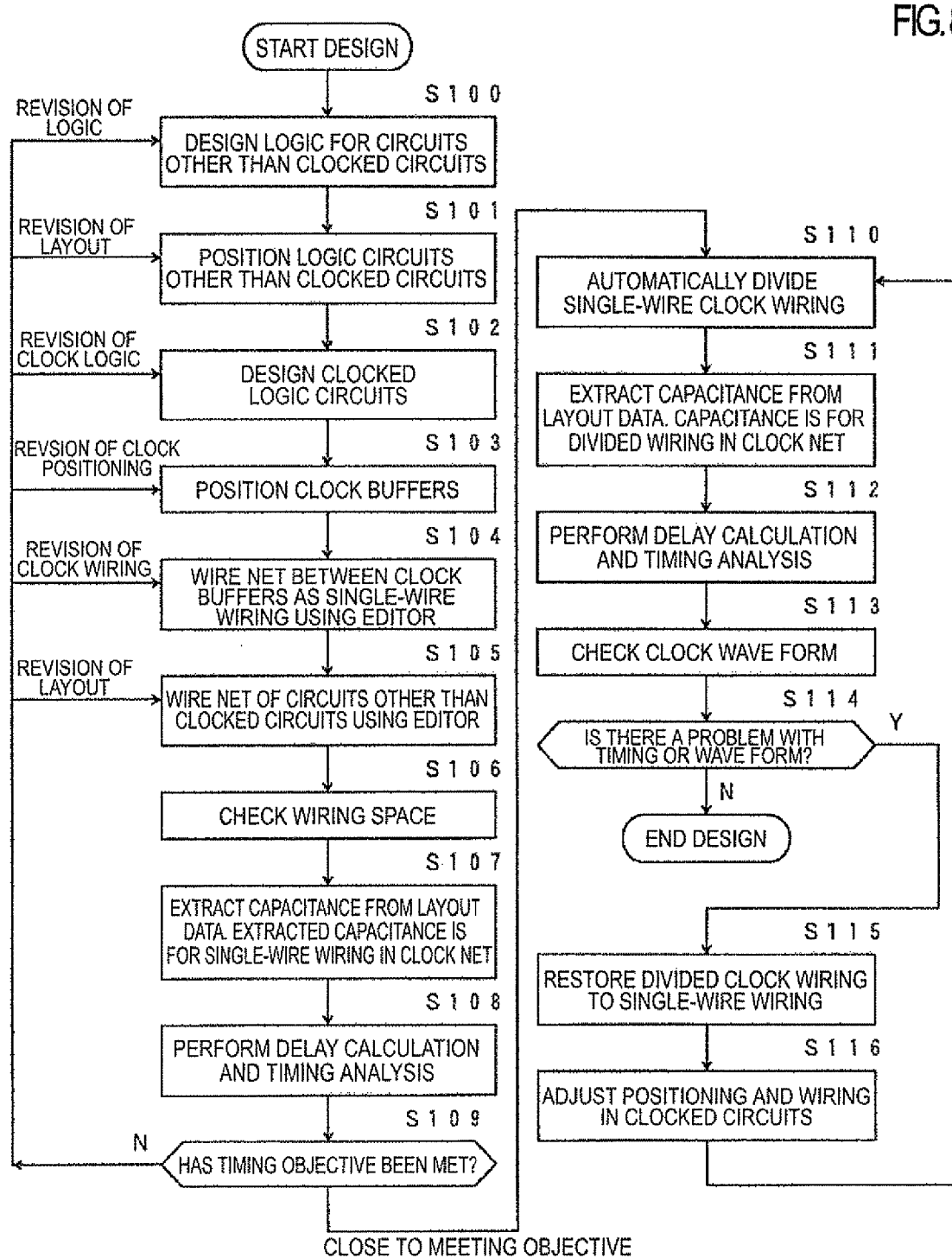
FIG. 8 is a flow chart illustrating a procedure executed by the integrated circuit designing device of the embodiment, according to various embodiments of the present invention.

The following is a summary of processing executed in accordance with the flowchart of FIG. 8 by the integrated circuit designing device 1 of the present embodiment with the above-described construction.

On beginning integrated circuit design, the integrated circuit designing device 1 of the present embodiment designs logic for circuits other than the clocked circuits in operation S100, and proceeds to position the logic for circuits other than the clocked circuits in operation S101, as shown in the flowchart of FIG. 8.

Next, in operation 102, the integrated circuit designing device 1 designs the logic for the clocked circuits, and proceeds, in operation S103, to position clock buffers.

Next, in operation S104, the integrated circuit designing device 1 uses single-wire wiring to wire a net between the clock buffers using an editor, and proceeds, in operation S105, to wire the net for circuits other than the clocked circuits using the editor.

Next, in operation S106, the integrated circuit designing device 1 checks the wiring space for the wiring determined in operation S104 and operation S105, and proceeds, in operation S107, to extract a capacitance (the circuit attribute required in delay calculations) from the layout data for the delay calculation. At this point, the capacitance extracted is for the single-wire wiring of the clock net.

Next, in operation S108, the integrated circuit designing device 1 performs delay calculations and timing analysis, and proceeds in operation S109 to judge whether a timing objective has been met.

When judging, in the judgment processing of operation S109, that the timing objective has not been met, the integrated circuit designing device 1 returns to the processing of operation S100 to operation S105, and repeats operations S100 to operation S105 until the timing objective is met.

When judging, on the other hand, that the timing objective has been met in the judgment processing of operation S109, the integrated circuit designing device 1 proceeds to operation S110, and automatically divides the single-wire clock wiring in accordance with the dividing rules.

Next, in operation S111, the integrated circuit designing device 1 extracts a capacitance (the circuit attribute value required for the delay calculations) from the layout data. This differs from operation S107 in that the capacitance extracted is for the clock net with divided wiring.

Next, in operation S112, the integrated circuit designing device 1 performs delay calculations and timing analysis, and proceeds, in operation S113, to check the clock wave form.

Next, in operation S114, the integrated circuit designing device 1 judges whether there is a problem with the timing or wave form, and when judging in the negative, ends the design of the integrated circuit.

When judging that there is a problem with the timing or the wave form in the judgment processing of operation S114, the integrated circuit designing device 1 proceeds to operation S115 and restores the divided clock wiring to the single-wire state. Next, in operation S116, the integrated circuit designing device 1 makes fine adjustments to the wiring and positioning of the clocked circuits with the clock wiring in the single-wire state, and returns to operation S110.

The integrated circuit designing device 1 then repeats the processing of operation S110 to operation S116 until obtaining, in the judgment processing of operation S114, a negative result indicating that there is no problem with the timing or wave form.

Thus, in the processing of operations S100 to S109, the integrated circuit designing device 1 of the present embodiment designs shielded clock wiring as single-wire wiring, and performs delay calculations and timing calculations. Then, when the timing objective has been substantially met, the integrated circuit designing device 1 proceeds to the processing of operations 8110 to S116, and performs processing to design the integrated circuit by dividing the shielded clock wiring, performing delay calculations and timing analysis, and, when necessary, making fine adjustments with the divided clock wiring restored to the single-wire state.

As described above, at this point, the thickness of the shielded clock wiring has been set so that the required space, between the pre-division shielded clock wiring and the neighboring wiring, calculated before division based on a prescribed function satisfies a condition on the required space, between the divided shielded clock wiring and the neighboring wiring, calculated after division based on the prescribed function. Therefore, an approximate judgment of the required space needed after division is possible using the pre-division judgment of the required space.

As described above, values which enable prescribed circuit attribute values to be realized for the divided shielded clock wiring are used as the circuit attribute values in delay calculations for the pre-division shielded clock wiring. Therefore, the delay calculations performed before division are approximations of the delay calculations to be performed after division.

Figure 9:
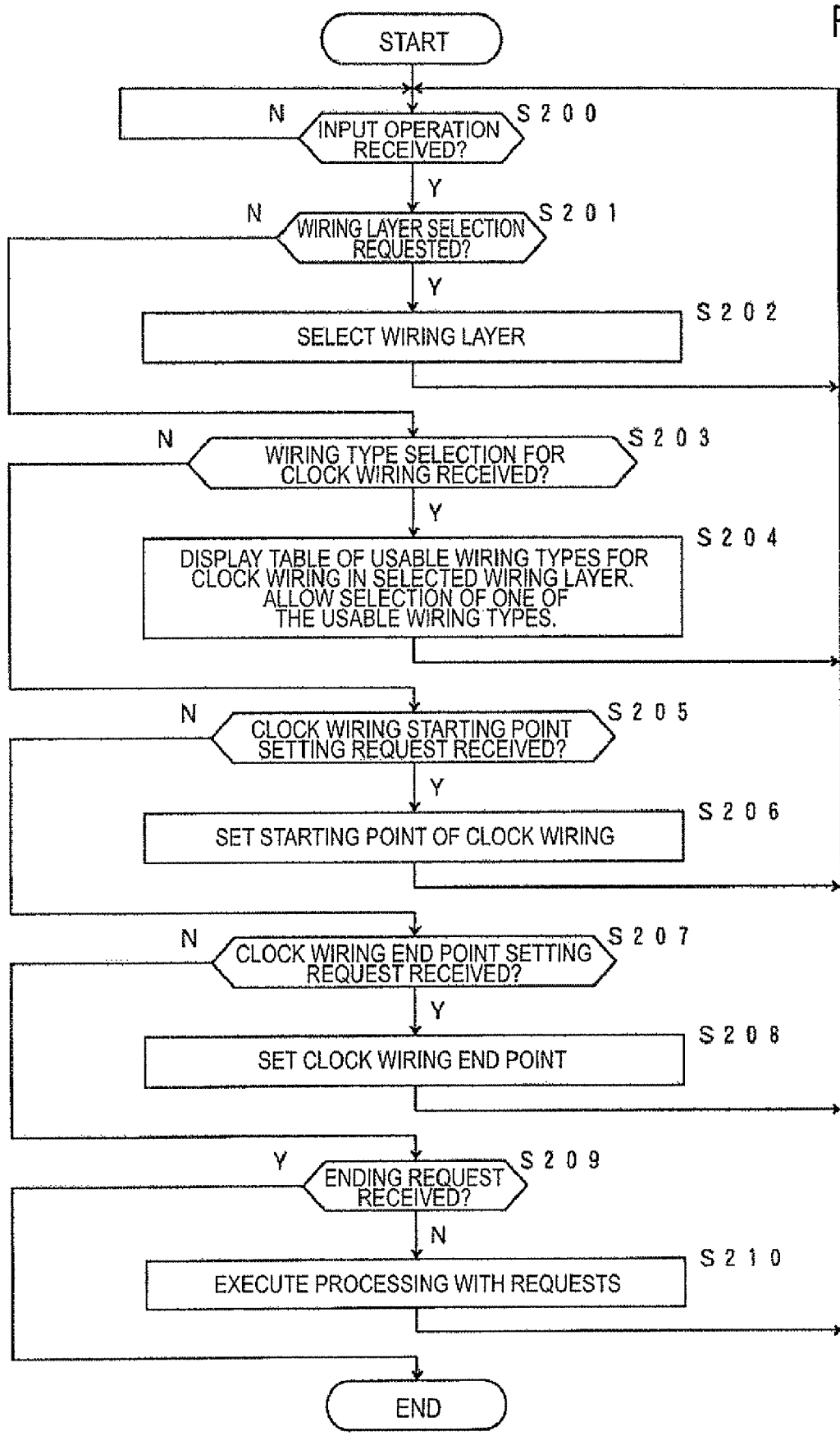
FIG. 9 is a flowchart illustrating a procedure of wiring processing for shielded clock wiring, according to various embodiments of the present invention.

The following describes details of the shielded clock wiring processing executed in operation S104 of the flowchart of FIG. 8, in accordance with the flowchart of FIG. 9. This processing is executed by the communication-type net wiring unit 105 shown in FIG. 1.

On receiving a wiring request for shielded clock wiring, the communication-type net wiring unit 105 waits for an input operation from an integrated circuit designer in operation S200 as shown in the flowchart of FIG. 9. On detecting the input operation in operation S200, the communication-type net wiring unit 105 proceeds to operation S201, and judges whether the input operation is a wiring layer selection request. When judging that the input operation is a wiring layer selection request, the communication-type net wiring unit 105 proceeds to operation S202, selects a wiring layer specified by the input operation, returns to the processing of operation S200, and waits for the next input operation.

On the other hand, when judging that the input operation is not a wiring layer selection request in operation S201, the communication-type net wiring unit 105 proceeds to operation S203, and judges whether input operation is a wiring type selection request for the shielded clock wiring.

In this judgment processing, when judging that the input operation is a wiring type selection request for the shielded clock wiring, the communication-type net wiring unit 105 proceeds to operation S204. In operation S204, the communication-type net wiring unit 105 specifies a table of the usable wiring types for shielded clock wiring in the wiring layer selected in operation S202 by referring to the defining information of the dividing rule defining unit 106, and displays the table on a display screen of the editor. The integrated circuit designer selects a wiring type from the table displayed on the screen. The communication-type net wiring unit 105 selects the type of shielded clock wiring using a selection operation, then returns to operation S200, and waits for the next input operation.

When, for instance, wiring layer 8 is selected in operation S202, the communication-type net wiring unit 10s refers to the defining information, of the type shown in FIG. 3, in dividing rule defining unit 106. As a result, wiring types such as "8-1" and "8-2" are specified as types of shielded clock wiring which can be used in the wiring layer 8, and displayed in a table on the display screen of the editor. By specifying one of the wiring types displayed in the table, the designer selects one of the shielded clock wiring types, such as "8-1" for instance.

When judging, on the other hand, that the input operation is not a wiring type selection request for the shielded clock wiring in the processing of operation S203, the communication-type net wiring unit 105 proceeds to operation S205, and judges whether the input operation is a setting request for setting a starting point of the shielded clock wiring. When the input operation is a setting request for a starting point of the shielded clock wiring, the communication-type net wiring unit 105 proceeds to operation S206, sets the starting point of the shielded clock wiring as specified by the input operation, returns to operation S200, and waits for the next input operation.

When, on the other hand, judging that the input operation is not the setting request for setting the starting point of the shielded clock wiring in the processing of operation S205, the communication-type net wiring unit 105 proceeds to operation S207, and judges whether the input operation is a setting request for setting an end point of the shielded clock wiring. When judging that the input request is the setting request for setting an end point of the shielded clock wiring, the communication-type net wiring unit 105 proceeds to operation S208, sets the end point of the shielded clock wiring as specified by the input operation, returns to operation S200, and waits for the next input operation.

When judging, on the other hand, that the input operation is not the setting request for setting the end point of the shielded clock wiring in the processing of operation S207, the communication-type net wiring unit 105 proceeds to operation S209, and judges whether the input operation is an ending request for ending the shielded clock wiring processing. When judging that the input operation is not the ending request for ending the shielded clock processing, the communication-type net wiring unit 105 proceeds to operation S210, executes any processing for existing requests, returns to operation S200, and waits for the next input operation. When judging, on the other hand, that the input operation is the ending request for ending the shielded clock wiring processing, the communication-type net wiring unit 105 ends the processing.

Thus, on receiving a wiring request for shielded clock wiring, through interaction with the designer of the integrated circuit, the communication-type net wiring unit 105 inputs wiring requests for shielded clock wiring by inputting wiring layers for the shielded clock wiring, wiring types for the shielded clock wiring, and starting points and end points for the shielded clock wiring.

By this input processing, inputted shielded clock wiring can be drawn on the display screen of the editor. However, during the input processing, the data checking unit 108 described below performs the processing described below to judge whether the inputted shielded clock wiring is spatially permissible. When the inputted shielded clock wiring is not permissible, a message stating this is displayed on the display screen of the editor, and processing to set the starting and end points is repeated.

Figure 10:
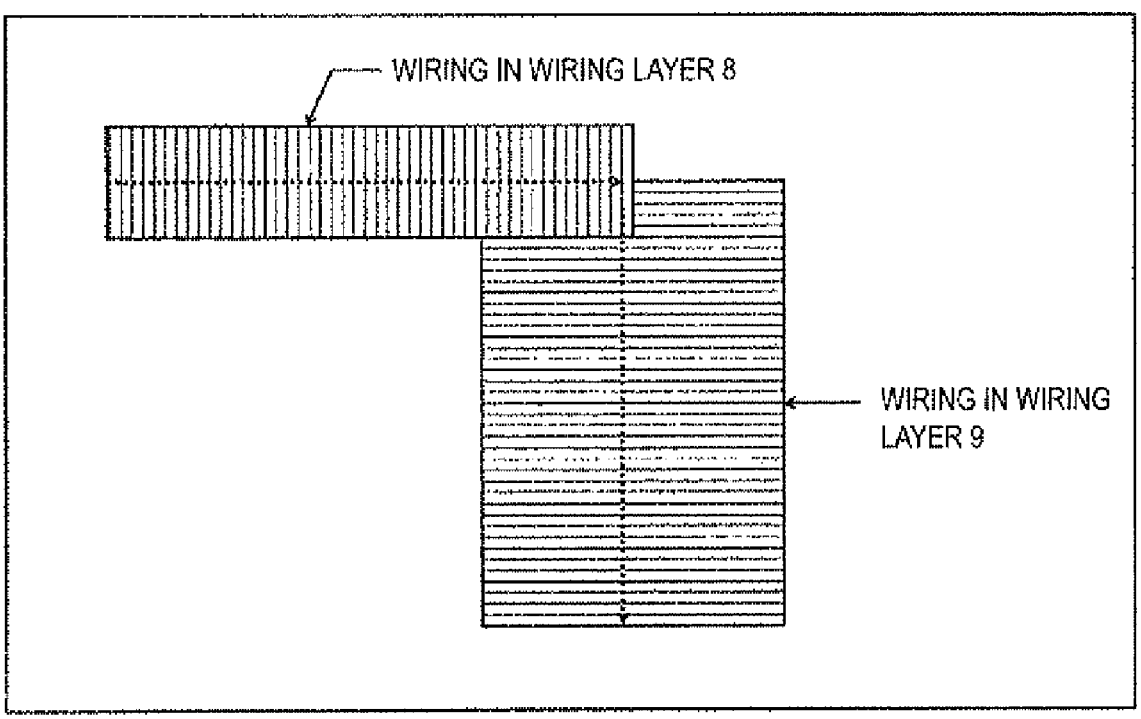
FIG. 10 is an illustrative example of a procedure for drawing shielded clock wiring, according to various embodiments of the present invention.

When the inputted shielded clock wiring is spatially permissible, the inputted shielded clock wiring is drawn on the display screen of the editor, as shown in FIG. 10. Processing is then performed to save the wiring information for the permissible wiring (such as wiring layer, wiring type, starting point, end point, and thickness) in the data structure held in the memory 103.

At this point, the thickness of the drawn shielded clock wiring is defined by the wiring defining unit 107. However, as described above, the thickness takes into account calculation processing, to be performed after division, relating to the required space between the shielded clock wiring and the neighboring wiring.

Figure 11:
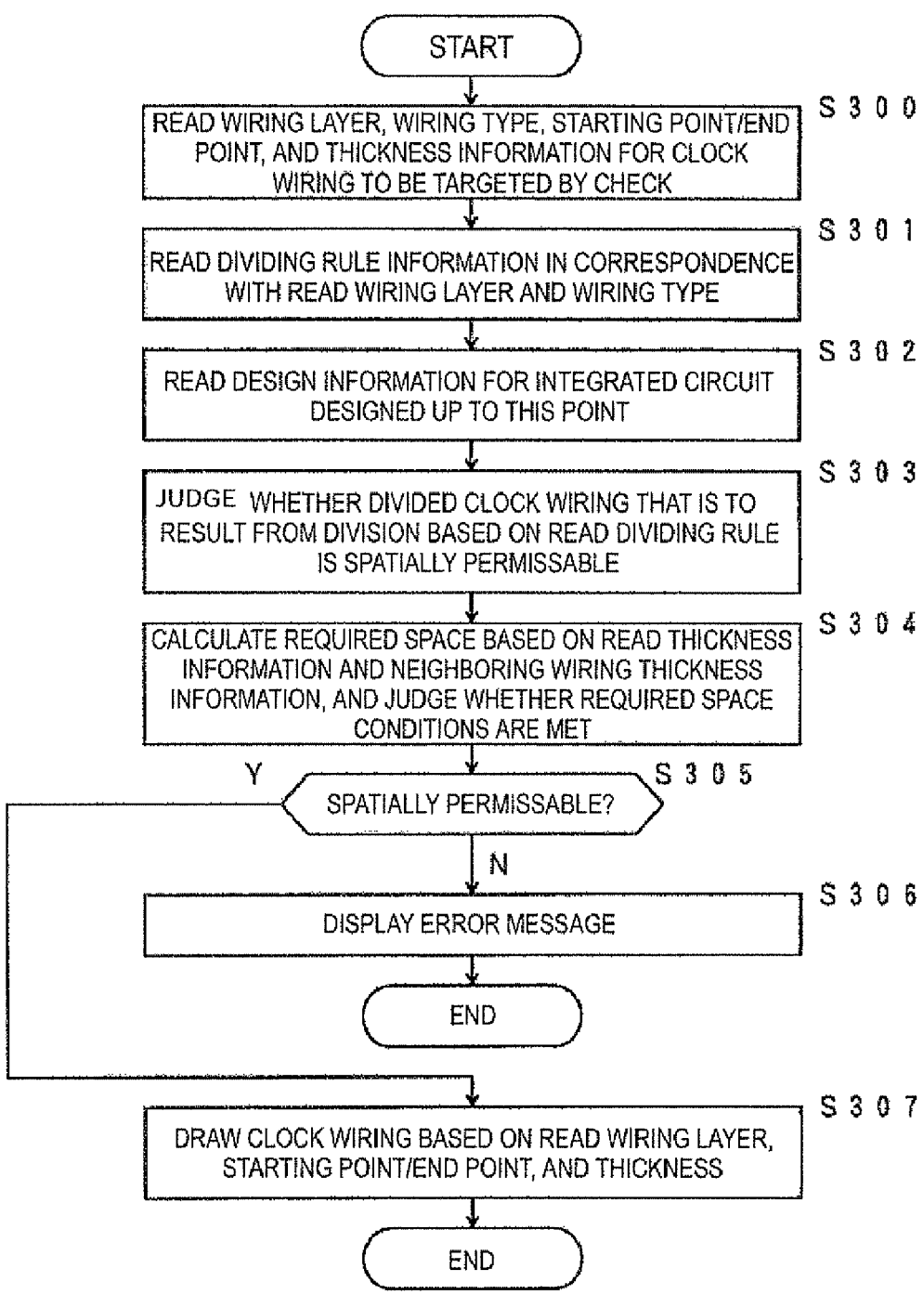
FIG. 11 is a flowchart of a procedure to check wiring space for shielded clock wiring, according to various embodiments of the present invention.

The following describes details of wiring space check processing for shielded wiring, executed in operation S106 of the flowchart of FIG. 8, in accordance with the flowchart of FIG. 11. This processing is executed by the data checking unit 108 shown in FIG. 1.

The data checking unit 108 specifies the shielded clock wiring targeted for checking, and, on receiving a wiring space check request, reads in operation S300 wiring information such as the wiring layer, the wiring type, the starting point, the end point, and the thickness (thickness defined by the wiring defining unit 107) of the targeted shielded clock wiring from the data structure held in the memory 103, as shown in the flowchart of FIG. 11.

Next, in operation S301, the data checking unit 108 reads the dividing rule information that corresponds to the read wiring layer and wiring type by referring to the defining information of the dividing rule defining unit 106. Next, in operation S302, the data checking unit 108 reads design information relating to the integrated circuit designed up to this point from the data structure held in the memory 103.

Next, in operation S303, the data checking unit 108 predicts the effects of dividing the targeted shielded clock wiring in accordance with the read dividing rules. The data checking unit 108 then judges whether the divided shielded clock wiring of the prediction is spatially permissible.

In the processing to judge wiring space, since there exist areas on the integrated circuit where cells and wiring cannot be positioned, the data checking unit 108 judges whether the divided shielded clock wiring of the prediction occupies any of these areas.

When the divided shielded clock is to include wiring in other wiring layers, the data checking unit 108 judges whether the wiring is spatially permissible in the other wiring layers. For instance, when the shielded wiring is to be divided as shown in FIG. 4, the data checking unit 108 judges whether the wiring is spatially permissible in wiring layer 8 and whether the wiring is spatially permissible wiring in layer 6.

Further, in the processing to judge wiring space, the data checking unit 108 takes into account the generation of vias and wiring that will require revision when divided.

Figure 12:
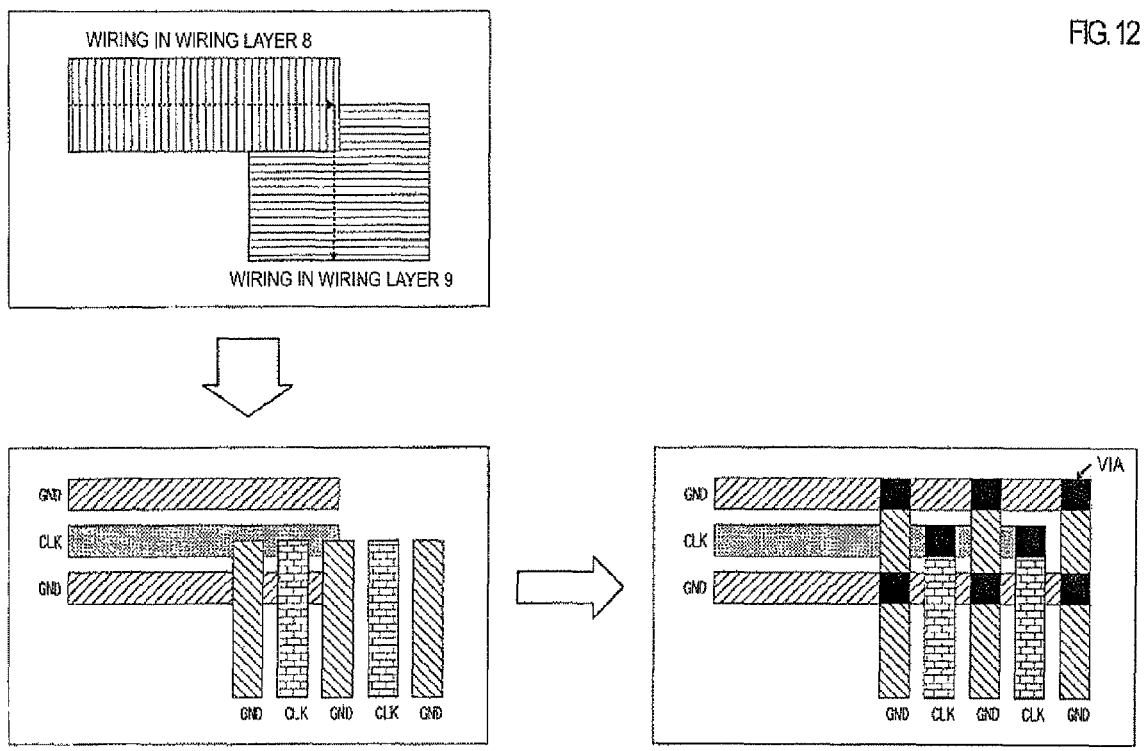
FIG. 12 is an illustrative example of a procedure for dividing shielded clock wiring, according to various embodiments of the present invention.

For instance, when the shielded clock wiring is bent to change wiring layers, two shielded clock wires may no longer fully connect, as shown in FIG. 10. As described below, if this type of area exists when actually dividing the shielded clock wiring, the clock wiring dividing unit 110 performs processing to extend the wiring resulting from the division so that the signal wires and the shield wires the of the two shielded clock wires connect as shown in FIG. 12. Similarly, if the division yields extra portions of wiring, the clock wiring dividing unit 110 revises the design to remove these portions. Moreover, the clock wiring dividing unit 110 performs processing to generate vias at the intersecting portions.

Hereinafter, in the processing to judge wiring space, wiring space judgments take into account the generation of vias and the wiring that will require revision when divided.

Next, in operation S304, the data checking unit 108 calculates the required space between the shielded clock wiring targeted for checking and the neighboring wiring, based on the thickness information, read in the processing of operation S300, for the targeted shielded clocked wiring and thickness information for the wiring adjacent to the shielded clock wiring. The calculation is performed in accordance with the f(x,y) formula:

$$\text{required space} = f(p, n)$$

where p is the thickness of the targeted shielded clock wiring and n is the thickness of the neighboring wiring.

By judging whether the space between the shielded clock wiring targeted for checking and the neighboring wiring is greater than required space resulting from the calculation, the data checking unit 108 judges whether the conditions for the required space have been met.

As described above, the thickness of the shielded clock wiring is set so that the required space, between the shielded clock wiring and the neighboring wiring, calculated before division based on a function f(x,y) meets the conditions for the required space, between the divided shielded clock wiring and neighboring wiring, calculated after division based on the function f(x,y). Hence, in the processing of operation S304, the data checking unit 108 can judge whether the conditions for required space have been met without predicting the results of dividing the shielded clock wiring targeted for checking.

Alternatively, the data checking unit 108 may judge whether the conditions for the required space have been met by predicting the results of dividing the shielded clock wiring targeted for checking. In this case, the neighboring wiring may also be shielded clock wiring, so it is necessary to predict the result of dividing the neighboring shielded clock wiring and perform judgment processing.

Thus, in operation S303 and operation S304, the data checking unit 108 performs processing for judging the wiring space, and proceeds in operation S305 to judge whether the wiring of the shielded clock wiring targeted for checking is spatially permissible. When the obtained judgment result is that the shielding wiring is not spatially permissible, the data checking unit 108 proceeds to operation S306, displays an error message for the designer of the integrated circuit, and ends the processing.

When, on the other hand, the obtained result is that the shielding wiring targeted for checking is spatially permissible, the data checking unit 108 proceeds to operation S307, and draws the shielded clock wiring targeted for checking on the display screen of the editor based on the information read in operation S300 about the wiring layer, the starting point and end point, and the thickness. The data checking unit 108 then ends the processing.

Thus, while performing design of single-wire wiring for the shielded clock wiring in accordance with the processing of operation S100 to operation S106 shown in the flowchart of FIG. 8, the integrated circuit designing device 1 of the present embodiment also executes the processing shown in the flowcharts of FIG. 9 and FIG. 11. Next in the processing of operation S107, the integrated circuit designing device 1 extracts the capacitance (the circuit attribute required in delay calculations) from the layout data, and performs, in the processing of operation S108, delay calculations and timing analysis based on the extracted capacitance.

Processing to determine the circuit attribute values necessary for the delay calculations is executed by the circuit attribute value determining unit 117 shown in FIG. 1. As described above, the circuit attribute value determining unit 117 determines the circuit attributes values of the pre-division shielded clock wiring so that input/output characteristics which are substantially the same as the input/output characteristics after the division can be realized.

With design information for the integrated circuit designed using single-wire shielded clock wiring as the processing target, the circuit attribute value determining unit 117 extracts the capacitance (the circuit attribute necessary for the delay calculation) from the layout in operation S107, and performs delay calculations and timing analysis based on the extracted capacitance value in operation S108. Here, although the processing is based on the circuit attribute value for the pre-division shielded clock wiring, the circuit attribute value has been determined so as to realize the circuit attribute value of the divided shielded clock wiring. Therefore, it is possible to perform a delay calculation substantially resembling the delay calculation necessary after division.

As described above, in the processing of operations S100 to S019, the integrated circuit designing device 1 of the present embodiment designs shielded clock wiring as single-wire wiring, and performs delay calculations and timing analysis. Then, when the timing objective has been met, the integrated circuit designing device 1 proceeds to the processing of operations S110 to S116, and executes processing to design the integrated circuit by dividing the shielded clock wiring, performing delay calculations and timing analysis, and, when necessary, making fine adjustments with the divided clock wiring restored to the single-wire state.

Figure 13:
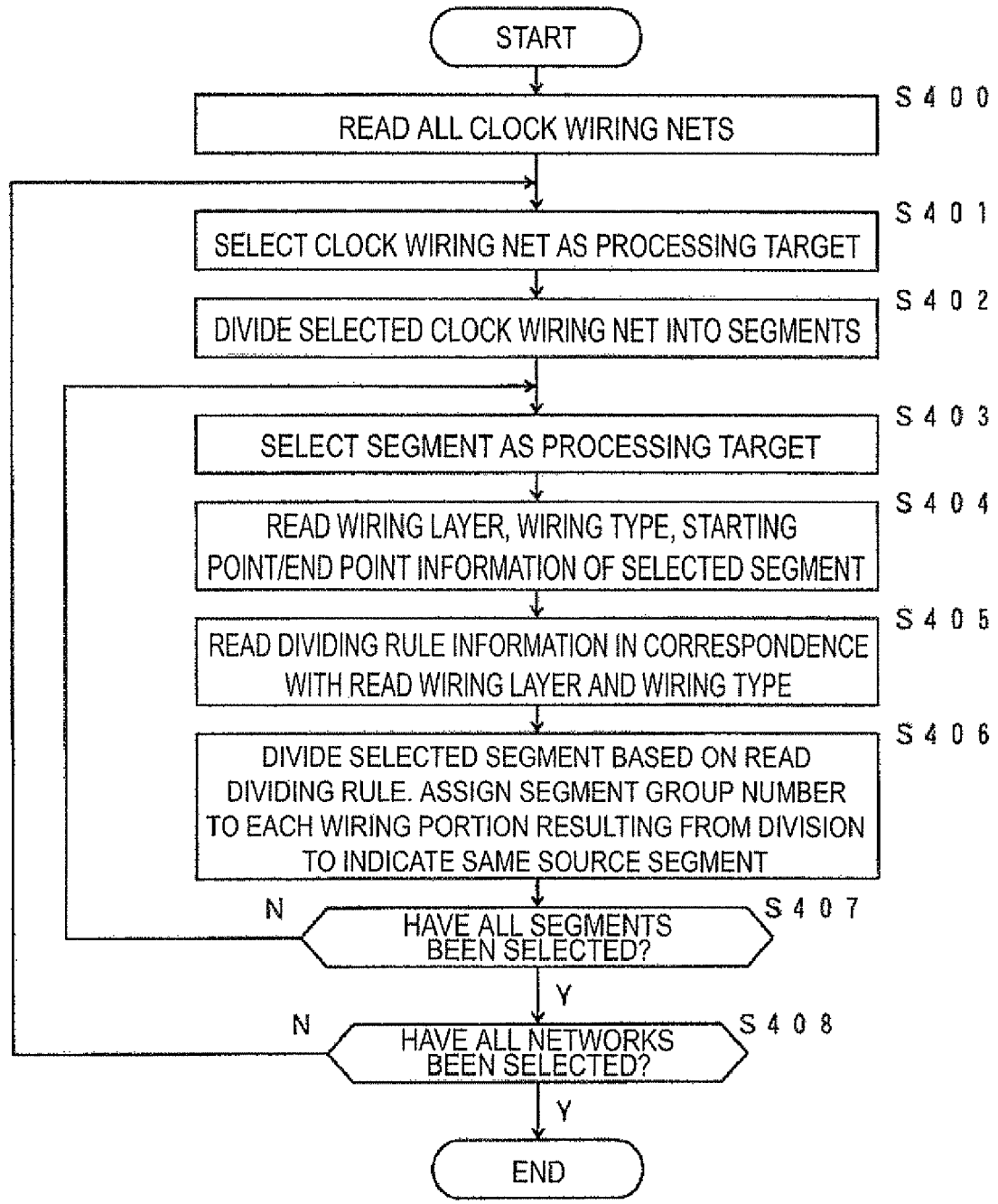
FIG. 13 is a flowchart of a procedure for dividing shielded clock wiring, according to various embodiments of the present invention.

The following describes details of the processing to divide the shielded clock wiring executed in operation S110 of the flowchart of FIG. 8, in accordance with the flowchart of FIG. 13. This processing is executed by the clock wiring dividing unit 110 shown in FIG. 1.

When activated by the designer of the integrated circuit after the designed integrated circuit has substantially met the timing objectives, the clock wiring dividing unit 110 reads, in operation S400, all the shielded clock wiring nets designed for the integrated circuit from the data structure held in the memory 103, as shown in the flowchart of FIG. 13. Next, in operation S401, the clock wiring dividing unit 110, selects from among the shielded clock wiring nets a single shielded wiring net to be the target of the processing.

Next, in operation S402, the clock wiring dividing unit 110, divides the selected shielded clock wiring net into segments (wiring portions having starting points and end points). Next, in operation S403, the clock wiring dividing unit 110 selects, from among the segments created by the division, a single segment to be the target of the processing.

Next, in operation S404, the clock wiring dividing unit 110 reads selected segment information such as the wiring layer, the wiring type, the starting point and the end point from the data structure held in the memory 103. Then, in operation S405, the clock wiring dividing unit 110 reads the dividing rule information that corresponds to the read wiring layer and wiring type by referring to the defining information of the dividing rule defining unit 106.

Next, in operation S406, the clock wiring dividing unit 110 divides the selected segment based on the read dividing rules, deletes the pre-division wiring information saved in the data structure held in the memory 103, and, in place of the deleted information, saves the wiring information (wiring layer, wiring type, starting point and end point, and thickness) resulting from the division. At this point, the clock wiring dividing unit 110 assigns a segment group number to each piece of wiring resulting from the division of the same segment.

According to this division processing, on reading the dividing rule corresponding to the shielded clock wiring identifier "8-1" from the dividing rule defining unit 106 which stores dividing rule defining information of the type shown in FIG. 3, the clock wiring dividing unit 110 divides the selected segment in the manner shown in FIG. 4.

Also, in this division processing, the clock wiring dividing unit 110 divides the shielded clock wiring while generating vias and making revisions to the divided wiring.

When the shielded clock wiring is bent to change wiring layers, the two shielded clock wires may no longer fully connect, as shown in FIG. 10. If this type of area exists when actually dividing the shielded clock wiring, the clock wiring dividing unit 110 extends the wiring resulting from the division so that the signal wires and the shield wires the of the shielded clock wiring connect as shown in FIG. 12. Similarly, if the division yields extra portions of wiring, the clock wiring dividing unit 110 performs a revision to remove these portions. Moreover, the clock wiring dividing unit 110 performs the division while generating vias at intersecting portions.

Also, when the wiring resulting from the division of the shielded clock wiring crosses over or under ground wiring a single layer away, the clock wiring dividing unit 110 performs the division while generating a via at the crossover portion.

Next, in operation S407, the clock wiring dividing unit 110 judges whether all segments divided in operation S402 have been selected, and, when judging the negative, returns to operation S403.

On the other hand, when judging in the processing of operation S407 that all the segments divided in operation S402 have been selected, the clock wiring dividing unit 110 proceeds to operation S408, and judges whether all the shielded clock wiring nets read in operation S400 have been selected. When judging that not all of the nets have been selected, the clock wiring dividing unit 110 returns to operation S401. When judging that all the nets have been selected the clock wiring dividing unit 110 ends the processing Thus, when dividing the shielded clock wiring, the integrated circuit designing device 1 of the present embodiment performs delay calculations and timing analysis based on the divided shielded wiring, and finalizes the design while checking the clock wave form to obtain the desired performance, as described in the flow chart of FIG. 8.

At this point, the integrated circuit designing device restores the divided shielded clock wiring to the pre-division single wire state, makes fine adjustments to the to the positioning of the clock buffers, revises the single-wiring shielded clock wiring based on the new positions, and once again divides the shielded clock wiring. This process allows efficient design of the integrated circuit.

To do this, the integrated circuit designing device 1 is provided with the divided-to-single clock wire restoring unit 111 shown in FIG. 1 for restoring the shielded clock wiring divided by the clock wiring dividing unit 110 to a single-wire state.

Figure 14:
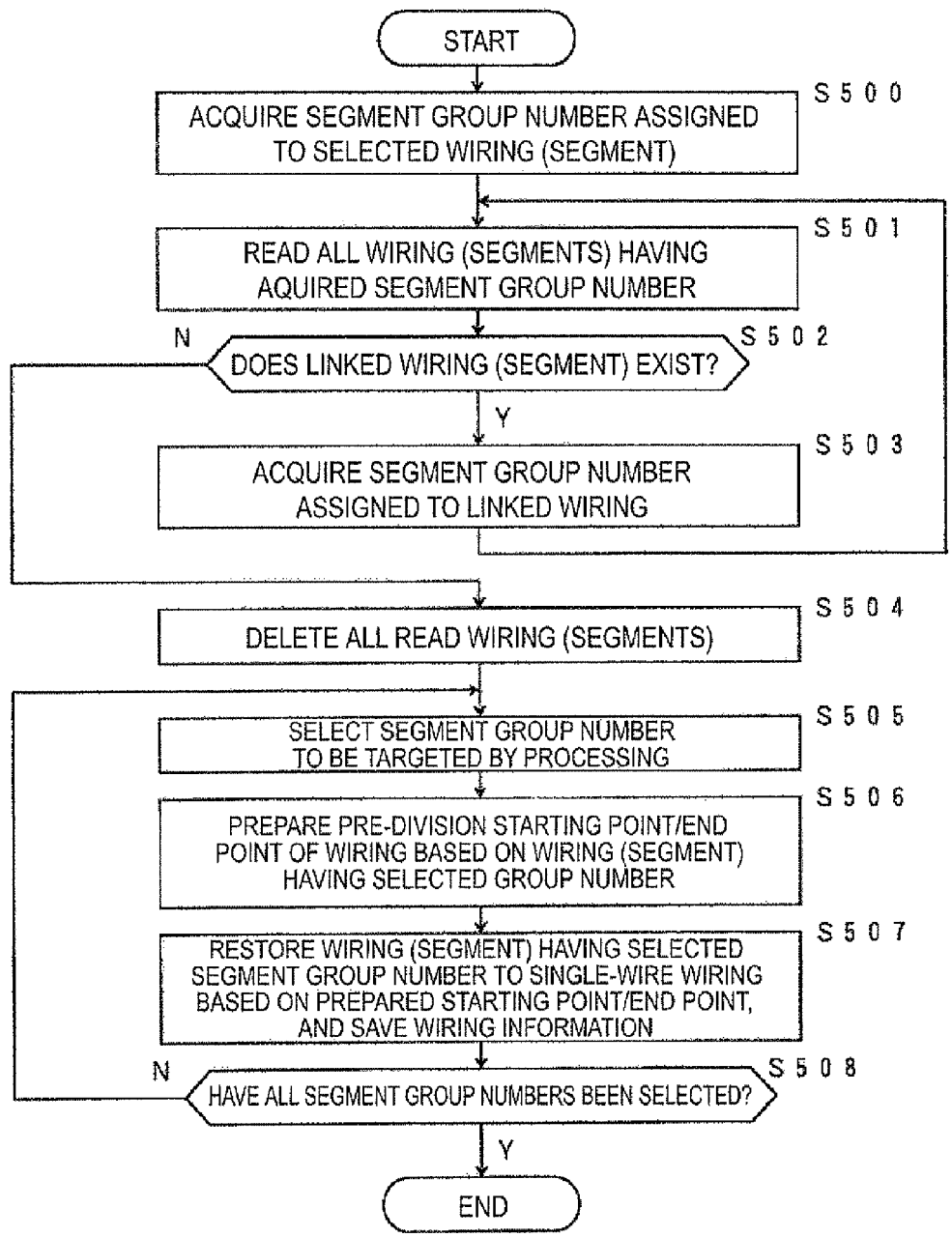
FIG. 14 is a flowchart of a procedure for restoring shielded clock wiring, according to various embodiments of the present invention.

The following describes details of the processing (executed in operation S115 of the flowchart in FIG. 8) by the divided-to-single clock wire restoring unit 111 to restore the divided shielded clock wiring to the single wire state, in accordance with the flowchart of FIG. 14.

On receiving a request from the integrated circuit designer to restore the pre-division shielded clock wiring from specified wiring generated by the division, the divided-to-single clock wire restoring unit 111 acquires, in operation 500, the segment group number associated with the specified wiring from the data structure held in the memory 103, as shown in the flow chart of FIG. 14.

Next, in operation S501, the divided-to-single clock wire restoring unit 111 reads all the wiring having the acquired segment group number (all the wiring resulting from division of the same segment) from the data structure held in the memory 103.

Next, in operation S502, the divided-to-single clock wire restoring unit 111 judges whether wiring exists that links to the read wiring (i.e. wiring with starting points and end points that connect to the starting point and end points of the read wiring). When judging that wiring linked to the read wiring exists, the divided-to-single clock wire restoring unit 111 proceeds to operation S503, acquires the segment group number associated with the linked wiring, and returns to the processing of operation S501.

Thus, by repeating the processing of operation S501 to operation S503, the divided-to-single clock wire restoring unit 111 creates a list of the wiring that connects to the wiring specified by the integrated circuit designer, and reads the wiring information for the wiring on the list.

When judging in operation S502, during repetition of the processing of operation S501 to operation S503, that all of the linked wiring has been processed, the divided-to-single clock wire restoring unit 111 proceeds to operation S504 and deletes the wiring information for the linked wiring from the data structure held in the memory 103. In this deletion processing, if vias generated by the clock wiring dividing unit 110 are present, the information relating to the vias is also deleted.

Next, in operation S505, the divided-to-single clock wire restoring unit 111 selects a segment group to be targeted by the processing from among the segment group numbers acquired in operation S500 and operation S503.

Next, in operation S506, the divided-to-single clock wire restoring unit 111 prepares pre-division starting points and end points based on the wiring associated with the selected segment group number. For instance, when division of the form shown in FIG. 12 has been executed, the divided-to-single clock wire restoring unit 111 specifies a central position of the wiring having the same segment group number, and prepares a starting point and end point based on a center line of the wiring.

Next, in operation S507, the divided-to-single clock wire restoring unit 111 restores the wiring associated with the selected segment group number to single-wire shielded clock wiring based on the prepared starting and end points, and saves the wiring information (such as wiring layer, wiring type, starting point/ending point, and thickness) in the data structure held in the memory 103. In this process, the thickness of the wiring is obtained by referring to the defining information of the wiring defining unit 107.

Next, in operation S508, the divided-to-single clock wire restoring unit 111 judges whether all the segment group number have been selected, and, when judging the negative, returns to operation S505. When judging that all the segment group numbers have been selected, the divided-to-single clock wire restoring unit 111 ends the processing.

Figure 15:
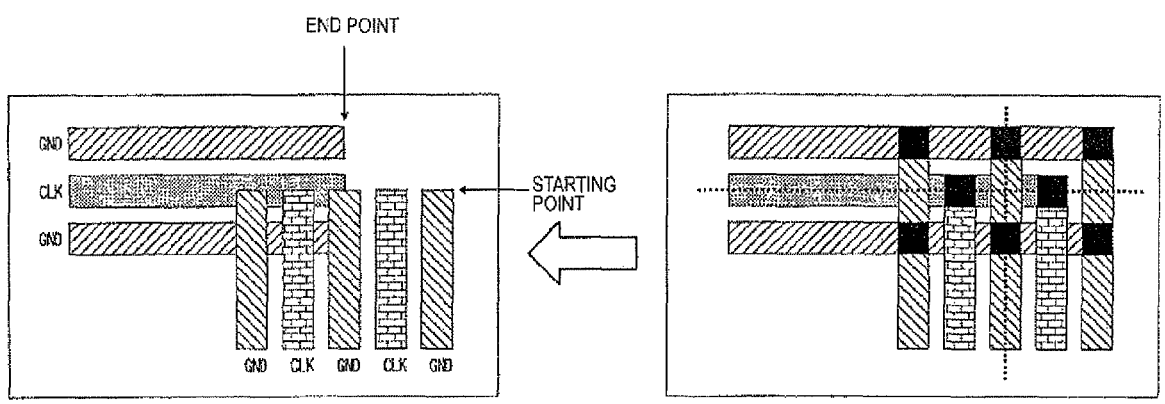
FIG. 15 is an illustrative example of a procedure for restoring shielded clock wiring, according to various embodiments of the present invention.

When all the segment group number have been selected, the wiring associated with the selected segment group number to single-wire shielded clock wiring is drawn on the display screen of the editor, as shown in FIG. 15. Processing is then performed to save the wiring information (such as wiring layer, wiring type, starting point/ending point, and thickness) in the data structure held in the memory 103.

Thus, the integrated circuit designing device 1 of the present embodiment initially designs shielded clock wiring as single-wire wiring, and performs delay calculations and timing calculations thereon. Then, when the timing objective has been substantially met, the integrated circuit designing device 1, designs the integrated circuit by dividing the shielded clock wiring, performing delay calculations and timing analysis, and, when necessary, performing fine adjustments with the divided clock wiring restored to the single-wire state.

In the present disclosure, the shielded clock wiring is designed by defining dividing rules describing the manner in which each portion of shielded wiring is to be divided, and, based on the dividing rules, dividing portions of shielded clock wiring for which single-wire wiring has been successfully completed. Moreover, an evaluation of the appropriateness of the shielded clock wiring carried out using single-wire wiring is performed using predictions about the divided state. Furthermore, the present disclosure allows shielded clock wiring that has been divided to be restored to the pre-division single-wire state.

According to the disclosure of this construction, designing shielded clock wiring using a single-wire format is effective. Wiring can be performed with the shielded clock wiring in the easily revised single-wire state, and shielded clock wiring that has been divided can be restored to the pre-division single-wire state. Hence, shielded clock wiring that has been divided can be revised collectively.

Thus, the present disclosure enables efficient design of the shielded clock wiring used in integrated circuits.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An integrated circuit designing device for performing wiring design of shielded clock wiring used in an integrated circuit, comprising:
   a storage unit configured to store
   a table of identifiers of shielded clock wiring usable in the integrated circuit and,
   dividing rule information in correspondence with each identifier, describing a way of dividing the shielded clock wiring indicated by the each identifier;
   an input unit configured to input
   a wiring layer of a shielded clock wiring of a wiring request,
   an identifier of the shielded clock wiring of the wiring request, and
   a starting point and an end point of the shielded clock wiring of the wiring request,
   and thereby input the wiring request for the shielded clock wiring;
   a specifying unit configured to refer to the storage unit to specify a dividing rule of the shielded clock wiring indicated by the identifier inputted by the input unit; and
   a judging unit configured to judge whether to permit the shielded clock wiring of the wiring request, by judging whether shielded clock wiring resulting from division based on the dividing rule specified by the specifying unit is spatially permissible.

2. The integrated circuit designing device according to claim 1, wherein:
   the storage unit stores identifiers of usable shielded clock wiring in correspondence with dividing rule information for each wiring layer, each dividing rule information describing a way of dividing the shielded clock wiring indicated by the corresponding identifier.

3. The integrated circuit designing device according to claim 1, wherein:
   a thickness of the shielded clock wiring requested in the wiring request is set so that a required space, between the shielded clock wiring and neighboring wiring, calculated based on a prescribed formula before division of the shielded wiring satisfies conditions of a required space, between divided shielded wiring and the neighboring wiring, calculated based on the prescribed formula after division of the shielded clock wiring.

4. The integrated circuit designing device according to claim 1, further comprising:
   a determining unit configured to
   calculate an attribute value to be held by shielded clock wiring that has been divided as an attribute value for use in a delay calculation for the shielded clock wiring of the wiring request; and
   set the calculated attribute value as the attribute value for use in the delay calculation.

5. The integrated circuit designing device according to claim 1, further comprising:
   a dividing unit configured to divide target shielded clock wiring based on a target shielded clock wiring dividing rule stored in the storage unit and to assign, to the divided shielded clock wiring resulting from the division of single-wire shielded clock wiring, group information indicating membership of a same group, the targeted shielded clock wiring being shielded clock wiring wired based on the wiring request.

6. The integrated circuit designing device according to claim 5, wherein:
   the dividing unit generates a via at the crossover portion when shielded wiring resulting from division of the shielded clock wiring crosses over or under ground wiring in a layer one layer away from the shielded wiring.

7. The integrated circuit designing device according to claim 5, wherein:
   when two sets of target shielded clock wiring for processing are connected by being bent to change wiring layers, the dividing unit revises wiring resulting from the division of the two sets of shielded clock wiring so that signal wires and shield wires of the respective sets of divided shielded clock wiring connect, and generates vias at intersecting portions.

8. The integrated circuit designing device according to claim 5, further comprising:
   a restoring unit configured to, based on the group information, delete divided shielded clock wiring resulting from division of original clock wiring by the dividing unit and restore the original shielded clock wiring.

9. An integrated circuit designing method executed by an integrated circuit designing device for performing wiring design of shielded clock wiring used in integrated circuits, comprising:

inputting a wiring layer of shielded clock wiring of a wiring request, an identifier of the shielded clock wiring of the wiring request, and a starting point and an end point of the shielded clock wiring of the wiring request, and thereby inputting the wiring request for the shielded clock wiring;

specifying a dividing rule of shielded clock wiring indicated by the inputted identifier, by referring to a storage unit configured to store a table of identifiers of shielded clock wiring usable in the integrated circuit and, in correspondence with each identifier, dividing rule information describing a way of dividing the shielded clock wiring indicated by the each identifier; and judging whether to permit the shielded clock wiring of the wiring request, by judging whether shielded clock wiring resulting from division based on the specified dividing rule is spatially permissible.

10. A recording medium having stored thereon an integrated circuit designing program used to realize an integrated circuit designing device for performing wiring design of shielded clock wiring used in integrated circuits, the integrated circuit designing program causing a computer to function as:

an input unit configured to input a wiring layer of a shielded clock wiring of a wiring request, an identifier of the shielded clock wiring of the wiring request, and a starting point and an end point of the shielded clock wiring of the wiring request, thereby inputting the wiring request for the shielded clock wiring;

a specifying unit configured to specify a dividing rule of shielded clock wiring indicated by the inputted identifier, by referring to a storage unit configured to store a table of identifiers of shielded clock wiring usable in the integrated circuit and, in correspondence with each identifier, dividing rule information describing a way of dividing the shielded clock wiring indicated by the each identifier; and a judging unit configured to judge whether to permit the shielded clock wiring of the wiring request, by judging whether shielded clock wiring resulting from division based on the dividing rule specified by the specifying unit is spatially permissible.

11. An integrated circuit designing device for designing specified wiring to be used in an integrated circuit, comprising a storing unit configured to store an identifier for specified wiring usable in an integrated circuit in correspondence with dividing rule information describing a way of dividing the specified wiring indicated by the identifier;

an input unit configured to receive input for a wiring request of the specified wiring by receiving input of a wiring layer for the specified wiring, the identifier for the specified wiring, and a starting point and an end point for the specified wiring;

a specifying unit configured to specify a dividing rule of the specified wiring indicated by the identifier inputted from the input unit, by referring to the storage unit using the identifier of the specified wiring; and a judging unit configured to judge whether to permit the specified wiring of the wiring request by judging whether placement of specified wiring resulting from division based on the dividing rule specified by the specifying unit is spatially permissible.

* * * * *